US008432164B2

(12) United States Patent
Kou et al.

(10) Patent No.: US 8,432,164 B2
(45) Date of Patent: Apr. 30, 2013

(54) FERROMAGNETIC RESONANCE AND MEMORY EFFECT IN MAGNETIC COMPOSITE MATERIALS

(75) Inventors: Xiaoming Kou, Newark, DE (US); Xin Fan, Newark, DE (US); Hao Zhu, Hockessin, DE (US); John Q. Xiao, Newark, DE (US)

(73) Assignee: University of Delaware, Newark, DE (US)

( * ) Notice: Subject to any disclaimer, the term of this patent is extended or adjusted under 35 U.S.C. 154(b) by 302 days.

(21) Appl. No.: 12/897,934

(22) Filed: Oct. 5, 2010

(65) Prior Publication Data

US 2011/0080241 A1  Apr. 7, 2011

Related U.S. Application Data

(60) Provisional application No. 61/248,631, filed on Oct. 5, 2009.

(51) Int. Cl.
*G01R 33/00* (2006.01)

(52) U.S. Cl.
USPC ........................................................ 324/260

(58) Field of Classification Search .................... 324/260
See application file for complete search history.

(56) References Cited

U.S. PATENT DOCUMENTS 5,030,371 A  7/1991  Mueller

FOREIGN PATENT DOCUMENTS

WO  0062311  10/2000

OTHER PUBLICATIONS

International Search Report dated Jun. 8, 2011, application No. PCT/US2010/051430.
Carignan, Louis-Philippe et al.; Double Ferromagnetic Resonance in Nanowire Arrays; Applied Physics Letters 95 062504; Aug. 10, 2009; American Institute of Physics 2009.

*Primary Examiner* — Reena Aurora
(74) *Attorney, Agent, or Firm* — RatnerPrestia

(57) ABSTRACT

Magnetic devices incorporating magnetic composite materials are disclosed. A tunable magnetic device includes magnetic composite material and a magnetic field source. The magnetic composite material includes an insulator and magnetic material embedded in the insulator. The magnetic material has a remanent magnetization. The magnetic field source is operable to apply a magnetic field to the magnetic composite material in order to change the remanent magnetization of the magnetic material. A magnetic device for detecting a magnetic pulse includes magnetic composite material and a sensor. The magnetic composite material includes an insulator and magnetic material embedded in the insulator. The magnetic material has a remanent magnetization. The remanent magnetization changes when the magnetic composite material receives the magnetic pulse. The sensor is positioned to determine the remanent magnetization of the magnetic material. The device detects the magnetic pulse based on a change in the remanent magnetization of the magnetic composite material.

20 Claims, 7 Drawing Sheets

500

550

1100

FERROMAGNETIC RESONANCE AND MEMORY EFFECT IN MAGNETIC COMPOSITE MATERIALS

FIELD OF THE INVENTION

The present invention relates generally to magnetic devices, and more particularly to ferromagnetic resonance and memory effect in magnetic composite materials.

BACKGROUND OF THE INVENTION

In recent years, magnetic composite materials have gained focus for their potential technological applications. Magnetic composite materials have particular magnetic characteristics not found in conventional electrical or magnetic components. These magnetic properties may enable the fabrication of improved magnetic devices.

One particular type of magnetic composite material is the magnetic nanowire. Arrays of magnetic nanowires have magnetic properties that may make them useful in electronic and magnetic device applications.

SUMMARY OF THE INVENTION

Aspects of the present invention are directed to magnetic devices incorporating magnetic composite materials.

In accordance with one aspect of the present invention, a tunable magnetic device is disclosed. The tunable magnetic device includes magnetic composite material and a magnetic field source. The magnetic composite material includes an insulator and magnetic material embedded in the insulator. The magnetic material has a remanent magnetization. The magnetic field source is operable to apply a magnetic field to the magnetic composite material in order to change the remanent magnetization of the magnetic material.

In accordance with another aspect of the present invention, a method of operating the above tunable magnetic device is disclosed. The method comprises the steps of applying a first magnetic field to the magnetic composite material to generate a first remanent magnetization for the magnetic composite material, and applying a second magnetic field to the magnetic composite material to generate a second remanent magnetization for the magnetic composite material, the second magnetic field having at least one different characteristic than of the first magnetic field, the second remanent magnetization different from the first remanent magnetization.

In accordance with yet another aspect of the present invention, a magnetic device for detecting a magnetic pulse is disclosed. The device comprises magnetic composite material and a sensor. The magnetic composite material includes an insulator and magnetic material embedded in the insulator. The magnetic material has a remanent magnetization. The remanent magnetization changes when the magnetic composite material receives the magnetic pulse. The sensor is positioned to determine the remanent magnetization of the magnetic material. The device detects the magnetic pulse based on a change in the remanent magnetization of the magnetic composite material determined by the sensor.

In accordance with still another aspect of the present invention, a method of detecting a magnetic pulse is disclosed. The method comprises the steps of receiving the magnetic pulse with a magnetic composite material, the magnetic composite material having a remanent magnetization, and detecting the magnetic pulse based on a change in the remanent magnetization of the magnetic composite material caused by the magnetic pulse.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures.

DETAILED DESCRIPTION OF THE INVENTION

Figure 1:
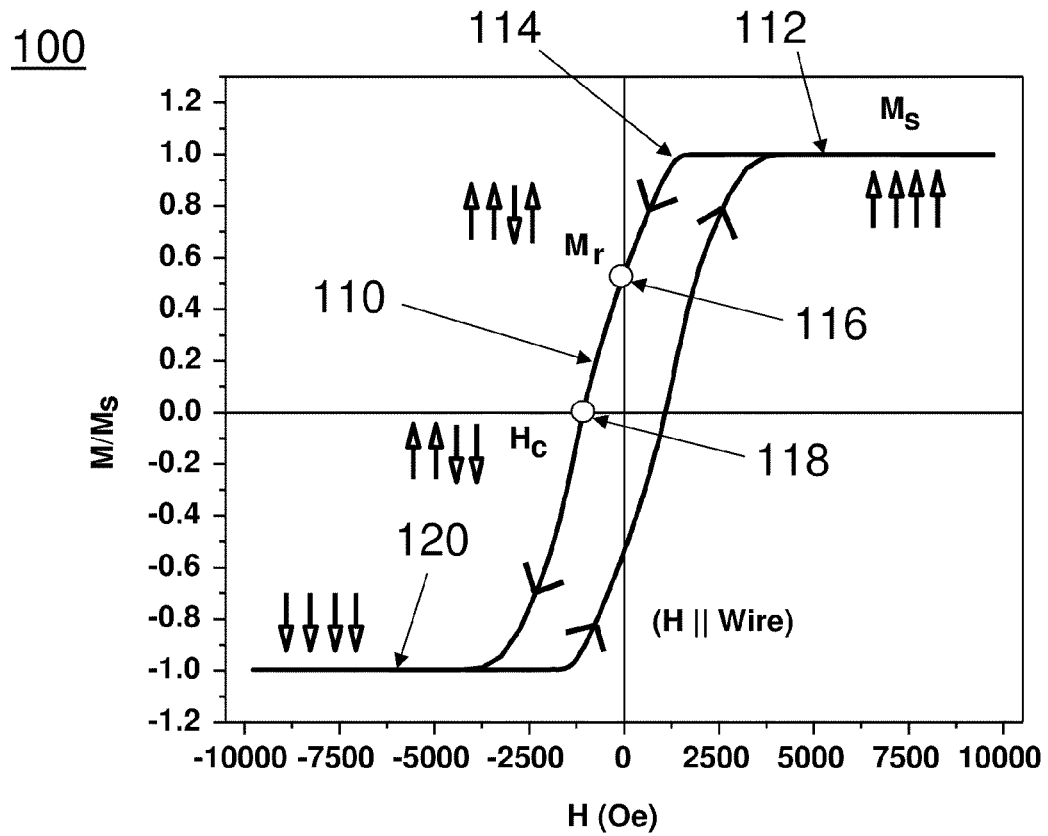
FIG. 1 is a graph illustrating the magnetization of a magnetic nanowire array, as a function of the applied magnetic field, in accordance with aspects of the present invention.

Aspects of the invention will now be described with reference to exemplary embodiments. Aspects of the invention are described herein in exemplary magnetic devices and methods incorporating magnetic composite materials. As used herein, the term "magnetic composite materials" is meant to encompass all suitable magnetic materials that are embedded in a non-magnetic material. Exemplary magnetic composite materials include, for example, magnetic particles, flakes, or nanowires, which are embedded in an insulating matrix, or magnetic thin film layers separated by non-magnetic thin film layers. Other suitable magnetic materials will be known to one of ordinary skill in the art from the description herein.

Magnetic composite materials will be discussed herein primarily with reference to magnetic nanowire arrays. Magnetic nanowire arrays may be particular suitable for use with the magnetic devices and methods of the present invention. In an exemplary embodiment, a magnetic nanowire array comprises a plurality of magnetic nanowires embedded in an insulating matrix. The nanowires desirably all have the same size, i.e., the same length and diameter.

In a non-rigorous way, individual nanowires of the magnetic nanowire array each have one magnetic domain; each nanowire may be thought of as a magnetic dipole (e.g., a bar magnet with a north and a south pole). Generally, when two magnetic dipoles are positioned close to each other, there is an interaction between them, referred to as a dipolar interaction. Consequently, when a plurality of magnetic nanowires are assembled together, as in a magnetic nanowire array, numerous dipolar interactions arise between the nanowires. These interactions give rise to a magnetic field (or a "dipolar field") for the nanowire array. The magnitude of the dipolar field depends at least in part on the material and size of each nanowire in the array, and more importantly, the separation between the nanowires. For example, shorter distances between the nanowires causes the magnetic nanowire array to generate a stronger dipolar field. The dipolar field may be utilized by magnetic devices for magnetic pulse detection, as will be described herein.

Magnetic nanowire arrays also have a remanent magnetization, i.e., a magnetization that is present in the nanowire arrays in the absence of an applied external magnetic field. Magnetization is the magnetic moment per unit volume that quantifies the strength of a magnet. For a single nanowire, the magnetization may be either parallel or antiparallel to the axis of the nanowire. The phrases "up magnetization" and "down magnetization" are used herein to describe parallel and antiparallel magnetizations for each nanowire, respectively. The magnitude of the magnetization of a single nanowire is dependent upon the material of the nanowire. The magnetization of the entire magnetic nanowire array depends on the numbers of nanowires with up magnetization, $N_{up}$, and the number of nanowires with down magnetization, $N_{down}$. Where all nanowires in the array have the same size and composition (i.e., all nanowires have magnetization equal in amplitude), the magnetization of the magnetic nanowire array is equal to the magnetization of a single nanowire multiplied by $(N_{up}-N_{down})/(N_{up}+N_{down})$.

Though the nanowire array has a remanent magnetization, the magnetization of the nanowire array may be changed by applying a magnetic field to the nanowire array from an external source. FIG. 1 is a graph 100 illustrating the magnetization of a magnetic nanowire array, as a function of the applied magnetic field. As shown in FIG. 1, the magnetization is illustrated as a hysteresis loop 110. At a high applied magnetic field, the magnetization of the nanowire array reaches a saturation magnetization $M_s$ (illustrated as region 112). In this region, all nanowires in the array are magnetized in the same direction, parallel to the direction of the applied magnetic field. Upon reducing the applied field beyond a certain value (i.e., below saturation), magnetizations of some of the nanowires start to flip, (e.g. change from up magnetization to down magnetization) and the overall magnetization of the nanowire array begins to decrease, as shown in region 114. The magnetization of the nanowire array when the applied magnetic field is zero is the remanent magnetization of the nanowire array, $M_r$ (shown at point 116). The applied magnetic field at which the magnetization of the nanowire array becomes zero is the magnetic coercivity of the nanowire array, $H_c$ (shown at point 118). As the field increases in the negative direction, the magnetization of the nanowire array approaches saturation in the opposite direction (shown as region 120).

The gradual change of the magnetization, i.e. the tilted shape of the hysteresis loop shown in FIG. 1, is due to the dipolar interactions among nanowires of the nanowire array. Applications of these dipolar interactions in the magnetic nanowire array are utilized in aspects of the present invention. One aspect generally comprises tuning the ferromagnetic resonance in magnetic composite material for high frequency applications. Another aspect generally comprises using a memory effect of the magnetic composite material to detect magnetic field pulses and electromagnetic waves. These and other aspects will be described below with reference to the accompanying drawings.

Figure 2:
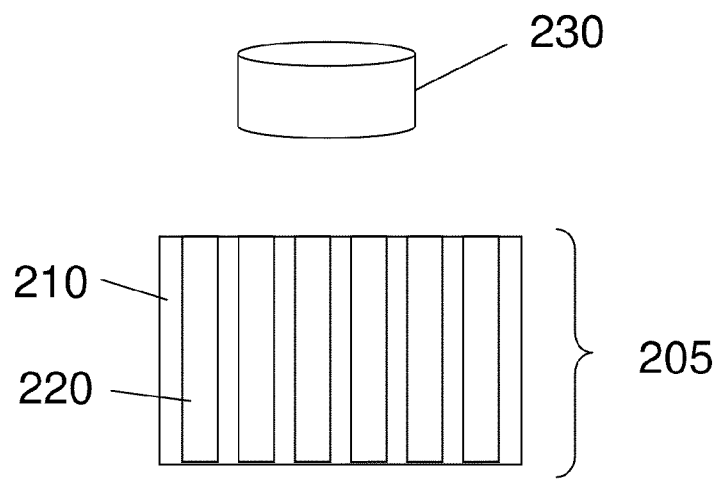
FIG. 2 is a diagram illustrating an exemplary magnetic device in accordance with aspects of the present invention.

FIG. 2 illustrates an exemplary magnetic device 200 in accordance with aspects of the present invention. Magnetic device 200 has a ferromagnetic resonance that may be tuned for use in specific applications, as will be described below. Generally speaking, magnetic device 200 includes magnetic composite material 205 and a magnetic field source 230. Magnetic composite material 205 includes insulator 210 and magnetic material 220. Additional details of magnetic device 200 are described below.

Insulator 210 encases magnetic material 220. Insulator 210 is formed such that separate magnetic elements of the magnetic material 220 are insulated from each other. The components and form of insulator 210 may be selected based on the magnetic material 220 that is used for device 200. In an exemplary embodiment, insulator 210 is a non-magnetic insulating matrix comprising aluminum oxide ($Al_2O_3$). Other suitable insulating matrices may include track-etched polymer membranes, copolymer-based templates or templates based on other oxides. In an alternative embodiment (not shown), insulator 210 may comprise non-magnetic thin film layers. Suitable insulating materials for use as insulator 210 will be known to one of ordinary skill in the art from the description herein.

Magnetic material 220 is embedded in insulator 210. Embedded magnetic material 220 has a remanent magnetization. This remanent magnetization may be present when the magnetic material 220 is first formed, or may be generated in the magnetic material 220. In an exemplary embodiment, magnetic material 220 is magnetic nanowire, as described above. Nanowires of the magnetic nanowire array may be formed from iron, nickel, cobalt, or magnetic alloys and compounds (e.g., $Ni_{90}Fe_{10}$, FePt, and $NiFe_2O_4$). Other suitable materials for use in creating magnetic nanowires for magnetic material 220 will be known to one of ordinary skill in the art from the description herein.

While magnetic composite material 205 is described herein primarily as a nanowire array, it will be understood that other magnetic composite materials 205 are suitable for use with device 200. For example, magnetic composite material 205 may comprise magnetic nanoparticles or flakes embedded in insulating matrices, and/or magnetic multilayer systems composed of alternately arranged magnetic layers or films and non-magnetic layers or films.

Magnetic field source 230 generates a magnetic field. Magnetic field source 230 may intermittently generate a magnetic field (e.g., an electromagnet) or may constantly generate a magnetic field (e.g., a permanent magnet). Magnetic field source 230 is operable to apply the magnetic field it generates to magnetic composite material 205. Magnetic field source 230 may desirably be positioned such that it applies the magnetic field in a direction parallel or antiparallel to the remanent magnetization direction of magnetic material 220. As will be explained herein, applying a magnetic field from source 230 to magnetic composite material 205 may operate to change the remanent magnetization of magnetic material 220. In an exemplary embodiment, magnetic field source 230 is an electromagnet. When current is applied to the electromagnet, magnetic field source 230 generates a magnetic field, which is applied to magnetic composite material 205. Magnetic field source 230 may desirably be operable to generate a plurality of magnetic fields having different magnetic field strengths or directions based on the current that is used to power the electromagnet. Suitable electromagnets for use as magnetic field source 230 will be known to one of ordinary skill in the art from the description herein.

Figure 3:
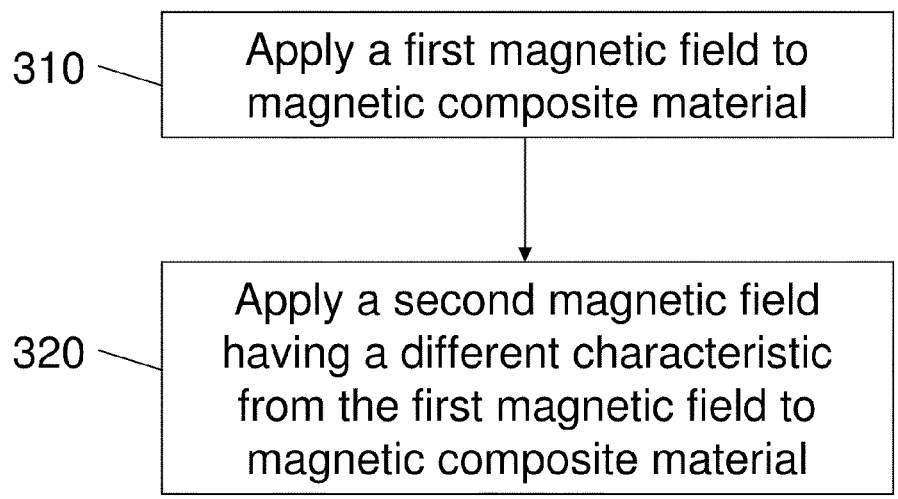
FIG. 3 is a flowchart illustrating an exemplary method for operating the exemplary magnetic device of FIG. 2.

The operation of magnetic device 200 will now be described with respect to FIGS. 3-6. FIG. 3 is a flowchart illustrating an exemplary method 300 for operating a tunable magnetic device. Method 300 utilizes the tunable ferromagnetic resonance of device 200. Additional details of method 300 are provided herein. For the purposes of illustration, the steps of method 300 are described herein with reference to the exemplary magnetic device 200 described above.

In step 310, magnetic field source 230 applies a first magnetic field to magnetic composite material 205. Application of this magnetic field generates a first remanent magnetization in magnetic material 220, as will be described below.

Figure 4:
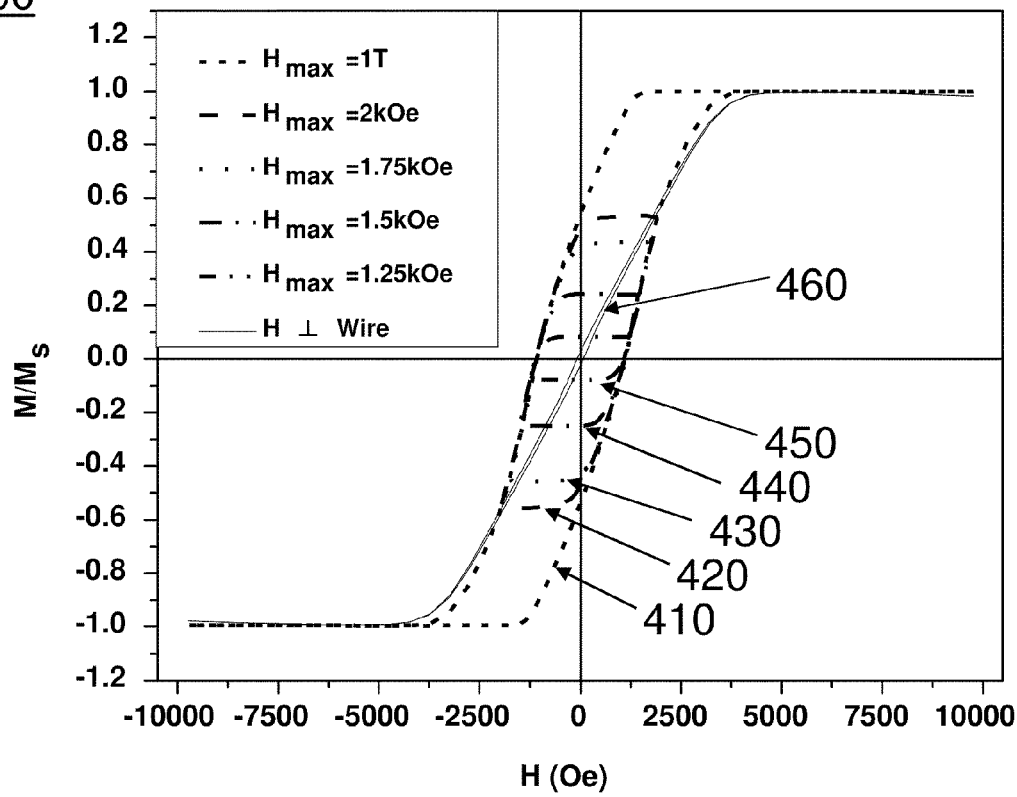
FIG. 4 is a graph illustrating hysteresis loops for the exemplary magnetic device of FIG. 2.

The ferromagnetic resonance (FMR) of device 200 may be tuned by changing the remanent magnetization of the material. Different remanent magnetizations may be generated in the magnetic material 220 by demagnetizing and magnetizing the sample according to one or more hysteresis loops. FIG. 4 is a graph 400 illustrating hysteresis loops for the exemplary magnetic device 200 having magnetic material 220 comprised of $Ni_{90}Fe_{10}$ nanowires. Before acquiring each loop, the nanowire array is demagnetized by magnetic field source 230, in order to reduce the remanent magnetization of the array to zero. This demagnetization may be performed, for example, by applying a magnetic field to the magnetic composite material equal in strength to its magnetic coercivity in the direction antiparallel to the remanent magnetization. Other processes for demagnetizing the magnetic composite material will be known to one of ordinary skill in the art from the description herein. Each loop of the graph represents exposure of the device 200 to a different maximum magnetic field from magnetic field source 230 after demagnetization. Lines 410-450 correspond to different maximum magnetic fields applied in a direction parallel or antiparallel to the remanent magnetization direction of the nanowires. Line 460 corresponds to a magnetic field applied in a direction perpendicular to the remanent magnetization of the nanowires.

As shown in FIG. 4, as the magnetic field applied by magnetic field source 230 changes from 1 Tesla (T) to 1250 Oersted (Oe), the magnetic material 220 shows different remanent magnetizations (i.e. the magnetization at 0 Oe applied field), ranging from 0.54 $M_s$ (for 1T applied field) to 0.09 $M_s$ (for 1250 Oe), where $M_s$ is the saturation magnetization. The magnetic coercivity for the magnetic material 220 remains consistently around 1100 Oe.

Accordingly, after demagnetization, the first magnetic field applied by magnetic field source 230 in step 310 generates a first remanent magnetization in the magnetic material 220 dependent both on the strength of the applied magnetic field and the saturation magnetization of the magnetic material 220.

In step 320, after demagnetization, a second magnetic field is applied by magnetic field source 230. This second magnetic field has at least one characteristic (e.g., strength or direction) different from the first magnetic field applied in step 310. Due to the different characteristic of the second magnetic field, the magnetization of device 200 follows a different hysteresis loop (as shown in FIG. 4), and the second magnetic field generates a second remanent magnetization in the magnetic material 220 different from the first remanent magnetization.

Using the above-described method, the remanent magnetization of magnetic device 200 may be tuned (or changed) by applying a preselected magnetic field with magnetic field source 230. The ferromagnetic resonance of magnetic device 200 is dependent at least in part on its remanent magnetization. Accordingly, this method may be used to tune the ferromagnetic resonance of magnetic device 200, as set forth below.

Generally, when magnetic material is in the presence of both a static magnetic field and microwave radiation, the magnetization of the magnetic material will precess around the direction of the static magnetic field at a certain microwave frequency. This phenomenon is referred to as ferromagnetic resonance (FMR), and this frequency as the ferromagnetic resonance frequency. The static magnetic field may include, for example, an applied magnetic field, anisotropy field, demagnetizing field, and/or a dipolar field. In an exemplary embodiment, the remanent magnetization of magnetic material 220 provides the dipolar field for device 200 in determining FMR. The resonance frequency is determined by the saturation magnetization of the magnetic material 220 ($M_s$), the shape anisotropy of the magnetic element of the magnetic material 220, and the dipolar field (i.e., the remanent magnetization).

Figure 5A:
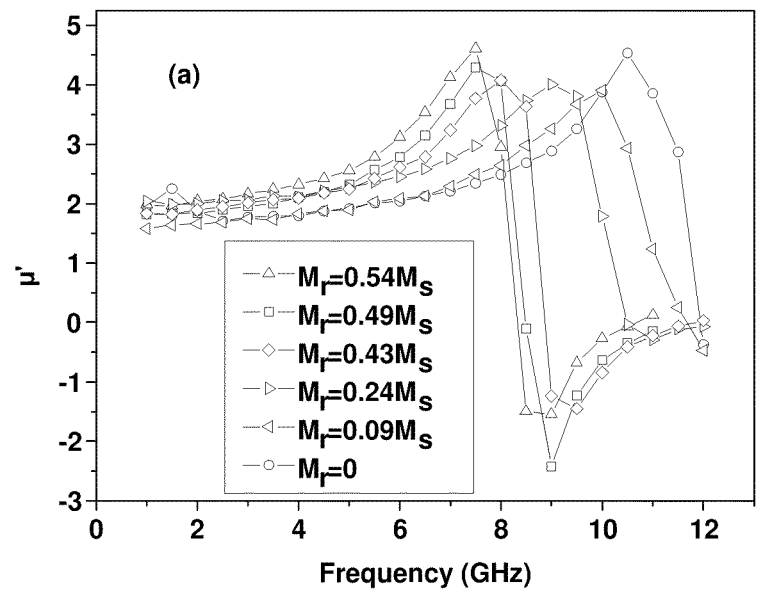
FIGS. 5A and 5B are graphs illustrating the complex magnetic permeability of the magnetic composite material of the exemplary magnetic device of FIG. 2 as a function of the microwave frequency.
Figure 5B:
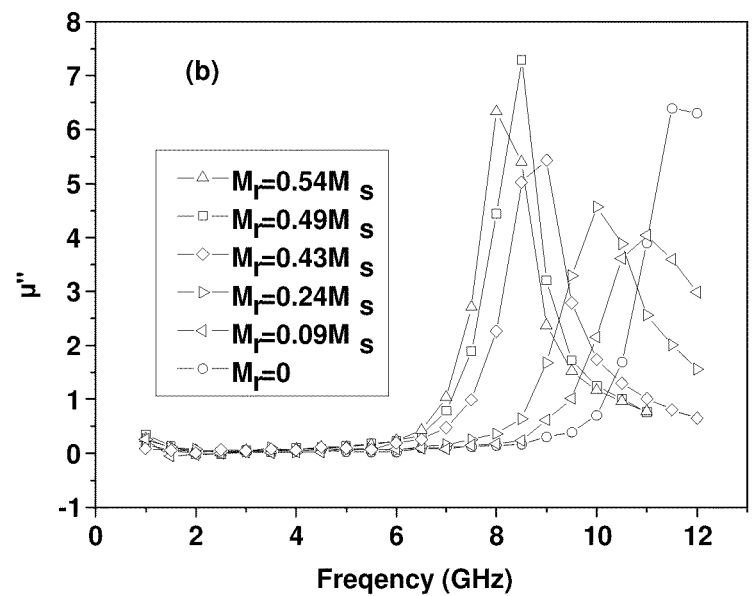

When FMR occurs, the magnetic composite material 205 substantially absorbs microwaves in order to sustain the precessional motion of the magnetization. The imaginary part ($\mu''$) of the complex magnetic permeability ($\mu=\mu'-j\mu''$) in graph 550 represents that absorption. Thus, magnetic composite material 205 will have a high peak value of $\mu''$ at the resonance frequency of the magnetic composite material 205. FIGS. 5A and 5B are graphs 500 and 550, respectively, illustrating the complex magnetic permeability of magnetic composite material 205 as a function of the microwave frequency. The graphs illustrate the magnetic permeability for exemplary magnetic composite materials comprising $Ni_{90}Fe_{10}$ nanowire arrays having different remanent magnetizations (denoted by the different lines).

Prior to each measurement, magnetic material 220 was first demagnetized and then magnetized (in a direction along the axis of the nanowires) with different maximum applied magnetic fields to obtain a desired remanent magnetization, as described above with respect to method 300. No external field was applied during the FMR measurement.

Figure 6:
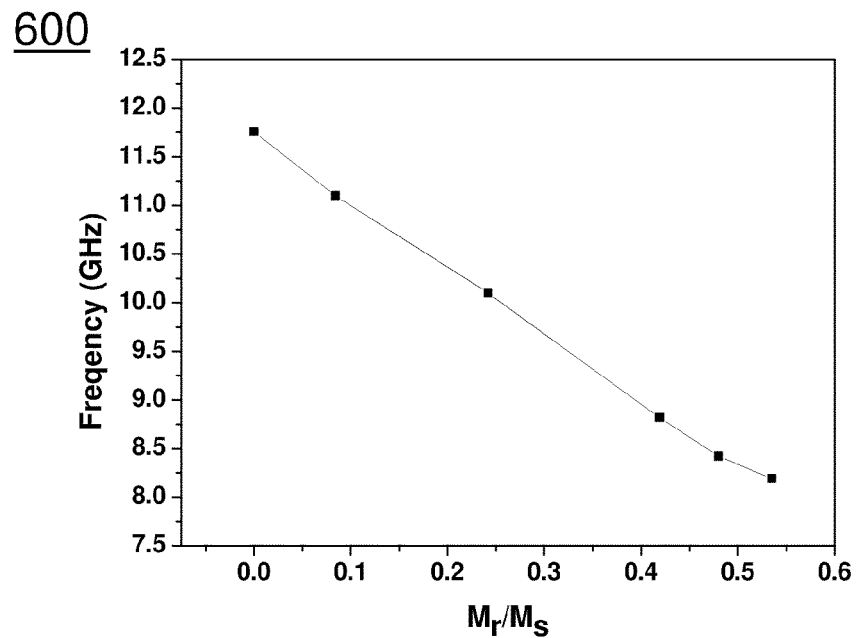
FIG. 6 is a graph illustrating the resonance frequency of the magnetic composite material of the exemplary magnetic device of FIG. 2 as a function of remanent magnetization.

As shown in FIGS. 5A and 5B, the ferromagnetic resonance effects (corresponding to peaks in graph 550) are observed in each measurement. In particular, graphs 500 and 550 show that as remanent magnetization of magnetic material 220 decreases, FMR frequency increases. FIG. 6 is a graph 600 illustrating the resonance frequency of magnetic composite material 205 as a function of remanent magnetization. As shown in FIG. 6, the FMR frequency can be tuned by preparing the sample with different remanent magnetizations, according to the method 300 described above. Magnetic composite material 205 may maintain the same resonance frequencies (according to the selected remanent magnetizations) for at least three months, thereby showing stability in the tuning of magnetic device 200.

The FMR tunability of magnetic device 200 may be attributed to magnetostatic dipolar interactions among the magnetic nanowires embedded in the non-magnetic insulator 210, which can be adjusted by changing the remanent magnetization. The maximum range of FMR tunability for device 200 is by the maximum remanent magnetization of the magnetic material 220 and the geometry of the magnetic material 220, which may include, for this exemplary embodiment, the nanowire diameter, inter-wire distance, and wire length. As shown in FIG. 6, for magnetic composite material 205 comprising $Ni_{90}Fe_{10}$ nanowires embedded in $Al_2O_3$ matrix, the FMR frequency can be continuously tuned from approximately 8.2 to approximately 11.7 GHz by changing the remanent magnetization of the magnetic material 220. As stated above, the remanent magnetization of magnetic material 220 is stable over a long period of time, e.g., greater than three months.

Further, magnetic device 200 may be tunable relatively quickly. Switching of the magnetic moment of magnetic composite material may be performed in a time scale of less than one microsecond. Accordingly, operating magnetic field source 230 for approximately one microsecond may be sufficient to retune magnetic device 200. Where magnetic field source 230 is an electromagnet, a current pulse in the order of a microsecond may be sufficient to change the remanent magnetization, and thereby, the resonance frequency of device 200. Rapid tuning of device 200 may be desirable in order to enable the use of higher current density for generating the applied magnetic field, to avoid overheating the coils of the electromagnet, and/or for reducing the size of device 200 due to the minimized requirement for any associated cooling system.

Figure 7:
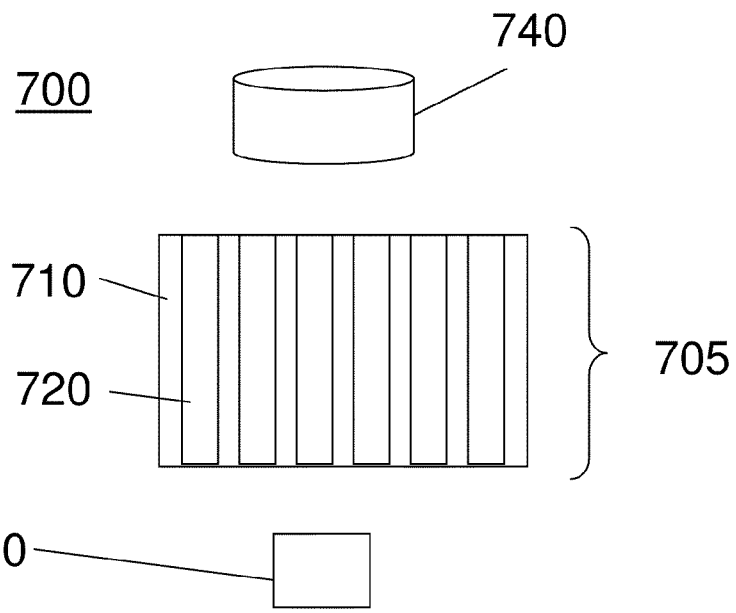
FIG. 7 is a diagram illustrating another exemplary magnetic device in accordance with aspects of the present invention.

FIG. 7 illustrates another exemplary magnetic device 700 in accordance with aspects of the present invention. Magnetic device 700 may be useful for detecting magnetic pulses, as will be described below. Generally speaking, magnetic device 700 includes magnetic composite material 705 and a sensor 730. Magnetic composite material 705 comprises an insulator 710 and magnetic material 720. Additional details of magnetic device 700 are described below.

Insulator 710 encases magnetic material 720. Insulator 710 is formed such that separate magnetic elements of the magnetic material 720 are insulated from each other. The components and form of insulator 710 may be selected based on the magnetic material 720 that is used for device 700. In an exemplary embodiment, insulator 710 is a non-magnetic insulating matrix comprising aluminum oxide ($Al_2O_3$), substantially as described above with respect to insulator 210.

Magnetic material 720 is embedded in insulator 710. Magnetic material 720 has a remanent magnetization. The remanent magnetization of magnetic material 720 changes when magnetic device 700 receives a magnetic pulse, as will be described below. In an exemplary embodiment, magnetic material 720 is magnetic nanowire, substantially as described above with respect to magnetic material 220.

Sensor 730 measures a detected magnetic field. Sensor 730 is positioned to measure the remanent magnetization of magnetic material 720. Sensor 730 may be used to determine at least one of the strength and direction of the remanent magnetization of magnetic material 720. In an exemplary embodiment, sensor 730 is a Hall-effect sensor. The Hall-effect sensor measures the surface magnetic field of the magnetic material 720, from which the remanent magnetization can be determined. Other suitable sensors for use as sensor 730 will be known to one of ordinary skill in the art from the description herein.

Additionally, magnetic device 700 may also include sensors that detect quantities in addition to the magnetic field produced by the magnetic material 720. For example, quantities such as the magnetization, inductance, and ferromagnetic resonance of the magnetic material 720 can also be measured. It will be understood that these parameters are related with the remanent magnetization of the magnetic material 720, and thus the magnetic field pulse received by the magnetic material 720. One sensor suitable for inclusion with device 700 is a vibrating sample magnetometer (VSM) for use in measuring the magnetization of the magnetic material 720.

Magnetic device 700 may further include a magnetic field source 740. Magnetic field source 740 generates a magnetic field. Magnetic field source 740 may intermittently generate a magnetic field (e.g., an electromagnet) or may constantly generate a magnetic field (e.g., a permanent magnet). Magnetic field source 740 is operable to apply the magnetic field it generates to magnetic material 720. Magnetic field source 740 may desirably be positioned such that it applies the magnetic field in a direction parallel or antiparallel to the remanent magnetization direction of magnetic material 720. In an exemplary embodiment, magnetic field source 740 is an electromagnet, substantially as described above with respect to magnetic field source 230. It is desirable in this embodiment that magnetic field source 740 produce a magnetic field having sufficient strength to saturate the magnetic composite material.

Magnetic device 700 may further include a control unit (not shown). A control unit may be used to read the signal from sensor 730 and translate the signal into the amplitude of the magnetic pulse, as will be explained below. The control unit may further be used to control magnetic field source 740, when it is necessary to use magnetic field source 740 to initialize device 700. In an exemplary embodiment, the control unit is a data processing element. Suitable components for use as the control unit will be known to one of ordinary skill in the art from the description herein.

Figure 8:
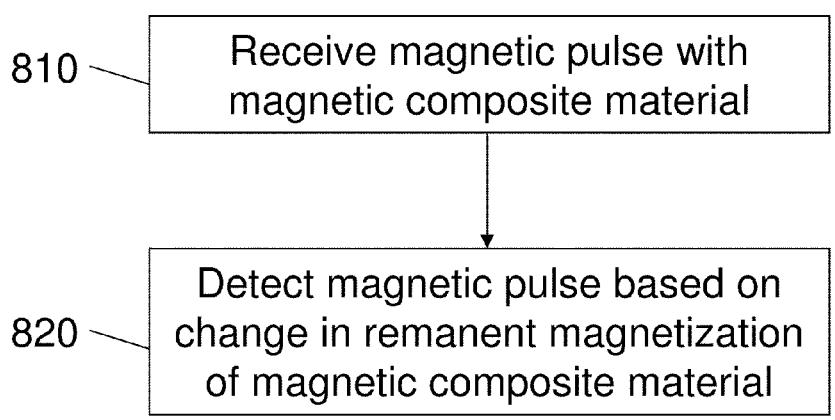
FIG. 8 is a flowchart illustrating an exemplary method for operating the exemplary magnetic device of FIG. 7.

The operation of magnetic device 700 will now be described with respect to FIGS. 8-10. FIG. 8 is a flowchart illustrating an exemplary method 800 for detecting a magnetic pulse. Method 800 utilizes the memory effect of device 700. Additional details of method 800 are provided herein. For the purposes of illustration, the steps of method 800 are described herein with reference to the exemplary magnetic device 700 described above.

In step 810, magnetic material 720 receives a magnetic pulse. After being initialized, magnetic composite material 705 may receive a magnetic pulse wirelessly, for example, by being positioned in the path of an electromagnetic pulse (EMP) or electromagnetic wave. It may be desirable that the magnetic pulse have a strength less than the magnetic coercivity of magnetic material 720.

In step 820, the magnetic pulse is detected based on a change in the remanent magnetization of magnetic material 720. When magnetic composite material 705 receives the magnetic pulse, the magnetic pulse may cause a change in the remanent magnetization of magnetic material 720. Device 700 may therefore be said to have detected a magnetic pulse when sensor 730 measures a change in the remanent magnetization of magnetic material 720. The change in the remanent magnetization caused by the magnetic pulse is due to the memory effect of the magnetic composite material 705, and will be described below.

Figure 9A:
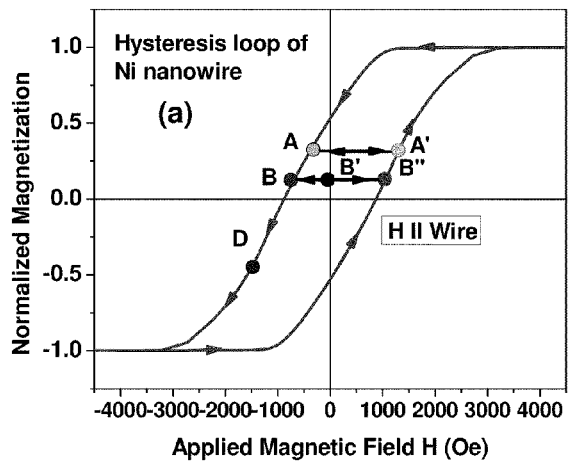
FIGS. 9A-9B are graphs illustrating hysteresis loops for the exemplary magnetic device of FIG. 7.
Figure 9B:
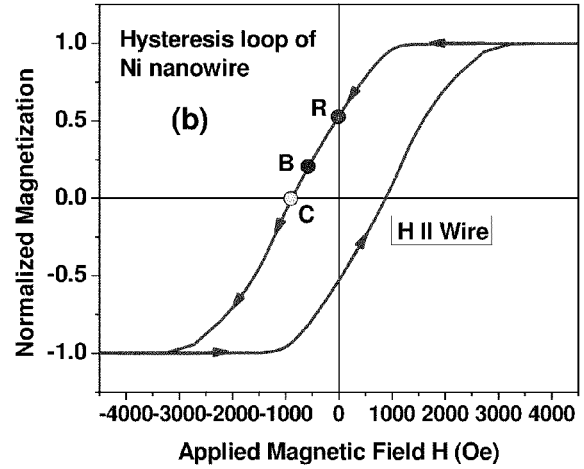

FIGS. 9A-9B are graphs 900 and 950, respectively, illustrating a hysteresis loop for the exemplary magnetic nanowire array. The magnetic field applied by magnetic field source 740 is parallel to the remanent magnetization of the nanowire array (along the axis of the nanowires).

Each point on the loop represents a magnetized state of the magnetic material 720, i.e. the magnetization at a certain applied magnetic field. For example, dot A in graph 900 represents a magnetic state A having a magnetization $M_A$ at the applied field $H_A$. Due to the dipolar field in the magnetic material 720, the change of the magnetization may be thought of as "irreversible," in that it can only follow the direction of the arrows on the loop.

This irreversibility is explained with reference to the accompanying figures. In FIG. 9A, it may be assumed the sample is in the magnetic state B (dot B) with the magnetization $M_B$ at an applied negative field $H_B$. Increasing the magnitude of the applied magnetic field to $H_D$, for example, will change the magnetic state of the magnetic composite material into the state D (dot D) with magnetization $M_D$. This is because such a change in applied magnetic field is along the direction of the arrows in graph 900. However, reducing the magnitude of the applied magnetic field to zero, for example, will not change the magnetic state of the magnetic composite material; the magnetization $M_B$ will stay the same, labeled as magnetic state B' (dot B'). This is due to the dipolar interactions between the nanowires of the magnetic material 720.

Increasing the applied magnetic field in the positive direction will not change the magnetization $M_B$ until the magnitude of the applied field exceeds $H_B''$ at state B'' (dot B''). In other words, the magnetization $M_B$ of the magnetic material 720 will remain unchanged at any applied field between $H_B$ and $H_B''$. To change the magnetization of the magnetic composite material from state B to state A' (dot A'), a positive field no less than $H_A'$ must be applied with magnetic field source 740.

Due to this irreversibility in the magnetization of the magnetic material 720, device 700 is usable to detect magnetic pulses having an amplitude in the range of $0 \sim -H_c$, where $H_c$ is the magnetic coercivity of the magnetic nanowire array (approximately 880 Oe in FIG. 9B). The minus sign indicates the amplitude of the detected magnetic pulse is in the negative direction. Such a procedure for detecting a magnetic pulse is described below.

Prior to detecting a magnetic pulse, it is desirable to initialize the nanowire array to a predetermined remanent magnetization. As shown in FIG. 9B, magnetic material 720 may be initialized to magnetic state R, having a remanent magnetization $M_r$. Magnetic material 720 may be initialized by saturating the sample with a large positive magnetic field applied by magnetic field source 740 (in a direction parallel to the axis of the nanowires, and/or the remanent magnetization of the magnetic composite material 705). The external field should then be removed, so that magnetic material 720 is influenced only by its remanent magnetization.

Alternatively, it may be desirable to initialize magnetic material 720 so that device 700 is usable to detect magnetic pulses having an amplitude in different ranges (for example, $-\delta \sim -H_c$), e.g., some predetermined offset from 0. This may be desirable to tune out background magnetic radiation from interfering with device 700. This may be done by applying initializing magnetic material 720 as described above, and then applying a small, predetermined negative magnetic field to adjust the remanent magnetization. The predetermined magnetic field may have a strength corresponding to the background magnetic radiation that is desired to be tuned out.

Magnetic device 700 may be used to detect magnetic pulses propagating primarily in a direction parallel or antiparallel to the remanent magnetization of the magnetic material 720. In order to detect magnetic pulses traveling in any direction, it may be desirable to utilize at least three pairs of magnetic devices 700 (each pair having a device for positive and negative pulse detection) oriented orthogonally with respect to each other (i.e. oriented in three principle axes x, y, and z, respectively).

When a magnetic pulse in the negative direction is received by magnetic material 720, the magnetic material 720 will be magnetized along the arrow in the hysteresis loop (from graph 950) from the remanent magnetic state R to another state, for example, state B. After the magnetic pulse is complete, the magnetic field applied to magnetic material 720 reduces to zero. At this point, the magnetic material 720 goes to state B' (as shown in graph 900) due to the irreversibility of the magnetization.

As shown in graph 950, the magnetization loop between state R and state C is approximately linearly proportional to the applied magnetic field. Accordingly, the magnitude of the change in remanent magnetization of magnetic material 720 may correspond to an amplitude of the magnetic pulse received by device 700. For example, the stronger the magnetic field pulse received by device 700, the smaller the resulting remanent magnetization of the magnetic material 720. When a positive magnetic pulse is present, the magnetic nanowire array will return to the same (initial) remanent state as long as the amplitude of the pulse is smaller than the magnetic coercivity of the magnetic composite material 705. This phenomenon may be referred to as the "memory effect" of the magnetic composite material.

Due to the memory effect, the magnetic material 720 having a remanent magnetization may be thought of as behaving similarly to a small bar magnet. A localized magnetic field $H_{surface}$ exists at the surface of the nanowire array, and is proportional to the remanent magnetization of the nanowire array. After the amplitude of the magnetic pulse is recorded in the nanowire array, sensor 730 can be utilized to measure the strength of the surface field, and thereby, read out the new remanent magnetization of the nanowire array, which corresponds to the magnetic field pulse.

The length of the magnetic pulse detected by device 700 may be based at least in part on the materials and geometry of the magnetic material 720. For example, by using materials with fast switching rate, such as FeNi, a magnetic pulse having a length less than approximately 100 picoseconds may be detected.

Figure 10:
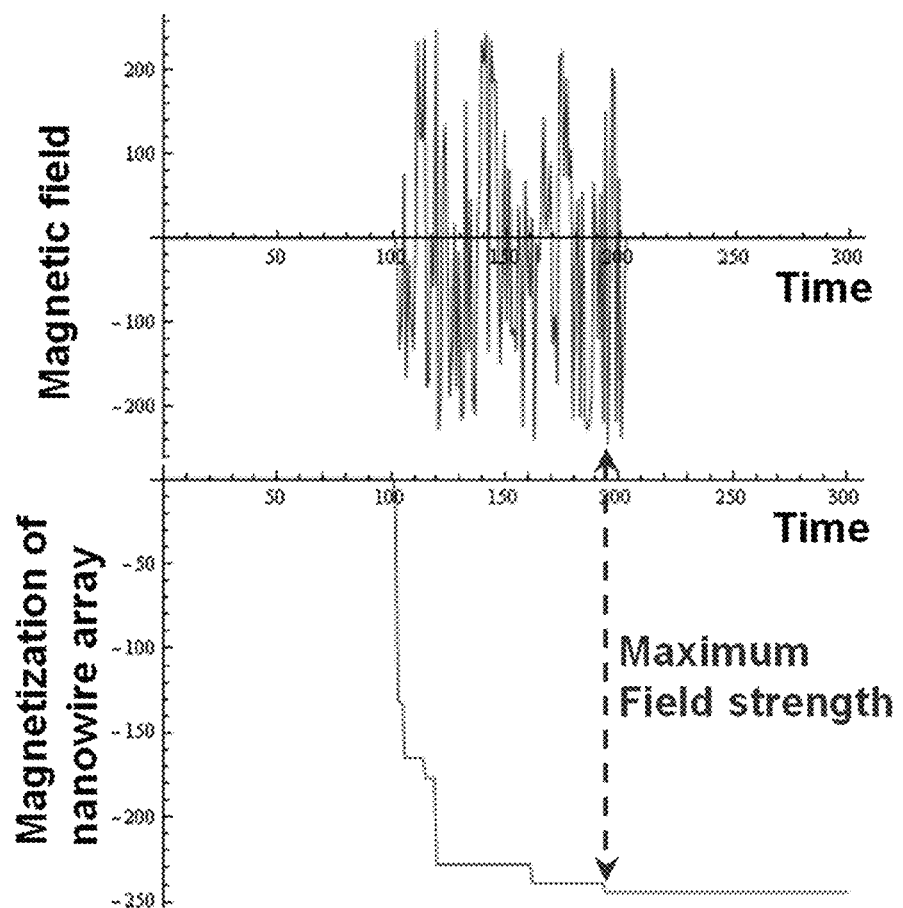
FIG. 10 is a graph showing the magnetization of the exemplary magnetic device of FIG. 7 in response to a plurality of magnetic pulses.

Device 700 may further be used to detect a plurality of magnetic pulses in series, as shown in FIG. 10. Where device 700 receives a series of magnetic pulses, the magnetic pulse having the greatest amplitude will be recorded. In addition, while device 700 has been described as detecting magnetic pulses in the negative direction, it will be understood by one of ordinary skill in the art that the device is not so limited. To measure magnetic pulses in the positive direction, a second probe may be used, which is initialized in the direction opposite that of the first probe. In one exemplary embodiment, six devices 700 may be used to detect magnetic pulses in any direction, each pair measuring x, y, z components of the field.

Device 700 may further be used to detect electromagnetic waves. In the case of a continuous electromagnetic wave instead of a magnetic pulse, the maximum magnetic field strength of the wave may be recorded. The maximum electric field can be calculated from the magnetic field using the impedance of the propagation media, as would be understood to one of ordinary skill in the art from the description herein.

Figure 11:
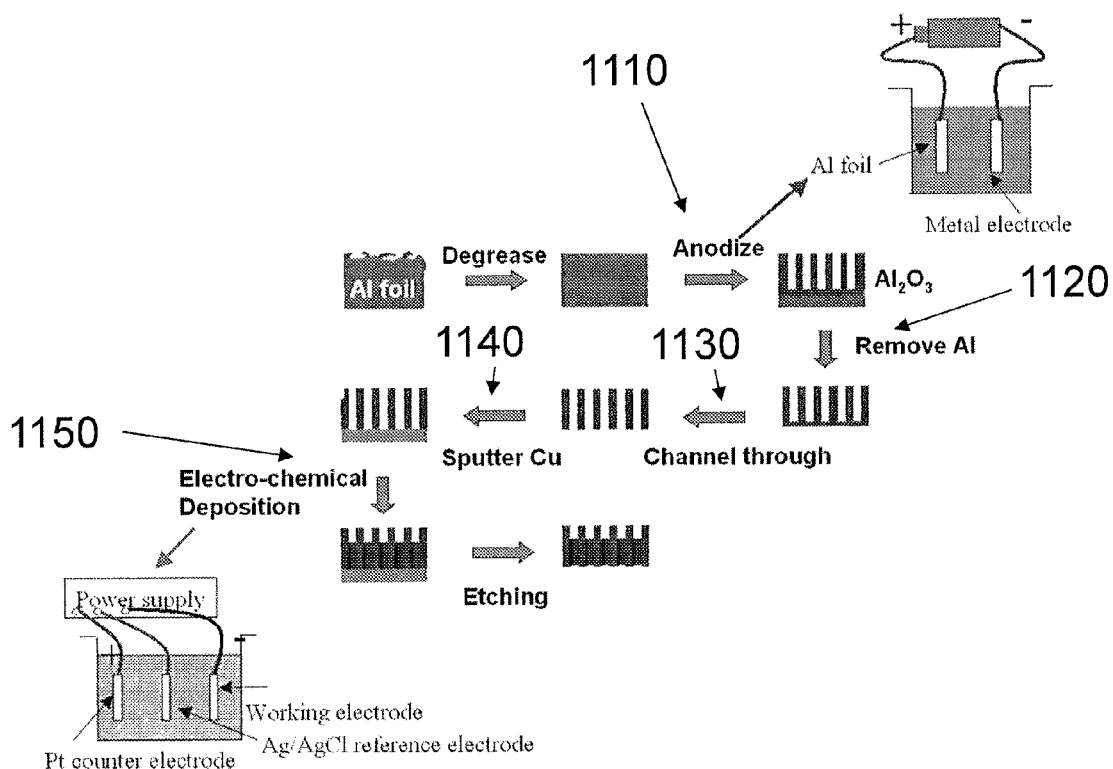
FIG. 11 is a diagram illustrating a conventional process for fabricating a magnetic nanowire array.

The fabrication of suitable magnetic composite material will now be described. FIG. 11 is a diagram illustrating a conventional process 1100 for fabricating a magnetic nanowire array. The process involves electrochemically depositing magnetic materials into an insulating template. Additional details on the process are described below.

In step 1110, an insulating template is prepared. In an exemplary embodiment, the insulating template is prepared by anodizing an aluminum foil using sulfuric acid. It may be desirable to degrease the aluminum foil prior to anodizing the foil. Suitable anodizing processes will be understood to one of ordinary skill in the art from the description herein. As a result of the anodizing process, a barrier of $Al_2O_3$ was formed in the aluminum foil having pore sizes of a few nanometers and inter-pore distances of approximately 60 nm. In step 1120, any remaining aluminum is removed from the $Al_2O_3$ barrier using conventional means.

Figure 12:
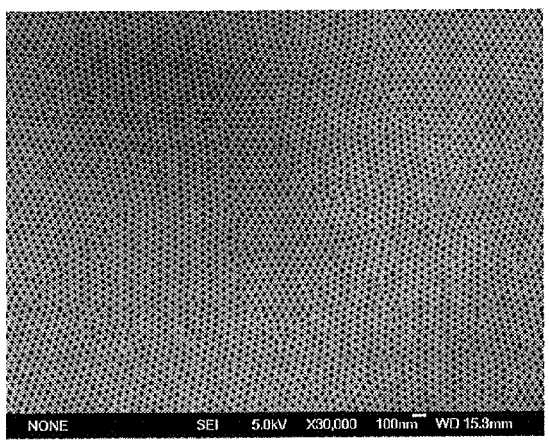
FIG. 12 is an image of an exemplary insulating template formed using the process of FIG. 11.

In step 1130, the bottom of $Al_2O_3$ barrier, developed during anodization, is removed. In an exemplary embodiment, the bottom of the $Al_2O_3$ barrier is removed by a phosphoric acid etching process. During the etching process, the pores of the barrier were widened to approximately 35 nm. This completes the formation of the insulating template. FIG. 12 is an image of the exemplary insulating template formed using the above-described process.

In step 1140, a copper layer is formed on the back of the insulating template. In an exemplary embodiment, the copper may be sputtered on the backside of the insulating template. Suitable sputtering processes will be known to one of ordinary skill in the art from the description herein.

Figure 13:
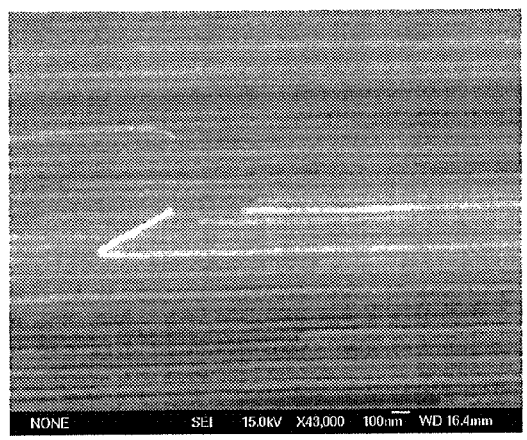
FIG. 13 is a cross-sectional image of the exemplary magnetic nanowire array formed using the process of FIG. 11.

In step 1150, the magnetic nanowires are synthesized. In an exemplary embodiment, $Ni_{90}Fe_{10}$ is deposited in the pores formed in the insulating template. The $Ni_{90}Fe_{10}$ is electrochemically deposited using a three-electrode configuration in which the back copper layer functions as the working electrode, a layer of platinum as the counter electrode, and a layer of Ag/AgCl as the reference electrode. The magnetic nanowires are formed with a length of approximately 17 μm. This completes the formation of the magnetic composite material. Following this step, the copper layer may be removed from the magnetic composite material and insulating template by a conventional etching process. FIG. 13 is a cross-sectional image of the exemplary magnetic nanowire array formed using the above-described process.

The above described magnetic devices and methods may achieve the following advantages over prior art magnetic devices. Each of the exemplary magnetic devices employs magnetic composite materials to achieve functionality not envisioned by the prior art. The magnetic composite materials described herein are particularly suitable for use in high frequency applications. They may have a relatively high saturation magnetization, limited eddy current loss, and exceptional penetration of microwaves.

With regards to the FMR embodiment, the FMR tunability disclosed herein may be useful for high frequency applications such as microwave filters, phase shifters, circulators, isolators, etc. Electronically tunable microwave band-stop filters are crucial in many communication and radar systems for suppression of frequency parasitics, spurious bands, or harmonics. Conventionally FMR-based microwave filters may require continuously applying an external field or tunable dielectric materials to achieve FMR tunability. This requires application of a continuous voltage. One particular advantage of aspects of this invention is that no continuous external field or voltage supply is required during operation With regards to the memory effect embodiment, the magnetic pulse detecting systems may have the following advantages compared to convention devices. The exemplary devices disclosed herein may be operable to capture a magnetic pulse as short as 100 ps. Additionally, for electromagnetic pulse spectra consisting of random field strength, the exemplary devices may be used to measure the maximum field strength of the magnetic pulse.

Additionally, the exemplary devices can function in electromagnetic (EM) fields as high as 70 kA/m (h field) and 2 MV/m (e-field) without breakdown. Conventional detection methods based on radio-frequency (RF) diode or thermal couples break down in an EM field having such strength.

Further, conventional devices may require antennas or electrodes for magnetic pulse detection, which are not required by the exemplary devices described herein. This means that the magnetic field pulse or electromagnetic wave under detection will be much less disturbed than with conventional devices.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A tunable magnetic device comprising:
magnetic composite material including:
an insulator; and
magnetic nanowires embedded in the insulator, the magnetic nanowires each having a length more than ten times greater than their respective diameter, the magnetic nanowires having a remanent magnetization; and
a magnetic field source operable to apply a magnetic field to the magnetic composite material in order to change the remanent magnetization of the magnetic nanowires.

2. The device of claim 1, wherein:
the magnetic nanowires comprise iron, nickel, cobalt, or a magnetic alloy or compound thereof, and
the insulator comprises one of an aluminum oxide matrix, a track-etched polymer membrane, a copolymer-based template, or an oxide-based template.

3. The device of claim 1, wherein:
the remanent magnetization has a remanent magnetization direction, and
the magnetic field source applies the magnetic field in a direction parallel or antiparallel to the remanent magnetization direction.

4. The device of claim 1, wherein the magnetic field source is operable to apply a plurality of magnetic fields to the magnetic composite material, the plurality of magnetic fields having different magnetic field strengths or directions.

5. The device of claim 1, wherein the magnetic nanowires each have a length more than two hundred times greater than their respective diameter.

6. A method of operating the tunable magnetic device of claim 1, the method comprising the steps of:
applying a first magnetic field to the magnetic composite material to generate a first remanent magnetization for the magnetic nanowires; and
applying a second magnetic field to the magnetic composite material to generate a second remanent magnetization for the magnetic nanowires, the second magnetic field having at least one different characteristic than of the first magnetic field, the second remanent magnetization different from the first remanent magnetization.

7. The method of claim 6, wherein the at least one different characteristic comprises a strength or a direction of the second magnetic field.

8. The method of claim 6, wherein:
the step of applying the first magnetic field comprises applying the first magnetic field in a direction parallel or antiparallel to a direction of the first remanent magnetization, and
the step of applying the second magnetic field comprises applying the second magnetic field in a direction parallel or antiparallel to a direction of the second remanent magnetization.

9. The method of claim 6, further comprising the step of demagnetizing the magnetic composite material.

10. A magnetic device for detecting a magnetic pulse, the device comprising:
magnetic composite material including:
an insulator; and
magnetic nanowires embedded in the insulator, the magnetic nanowires each having a length more than ten times greater than their respective diameter, the magnetic nanowires having a remanent magnetization, the remanent magnetization changing when the magnetic composite material receives the magnetic pulse; and
a sensor positioned to determine the remanent magnetization of the magnetic nanowires,
wherein the device detects the magnetic pulse based on a change in the remanent magnetization of the magnetic composite material determined by the sensor.

11. The device of claim 10, wherein:
the magnetic nanowires comprise iron, nickel, cobalt, or a magnetic alloy or compound thereof, and
the insulator comprises one of an aluminum oxide matrix, a track-etched polymer membrane, a copolymer-based template, or an oxide-based template.

12. The device of claim 10, further comprising a magnetic field source operable to apply a magnetic field to the magnetic composite material in order to initialize the magnetic nanowires to the remanent magnetization.

13. The device of claim 12, wherein:
the initial remanent magnetization has a remanent magnetization direction, and
the magnetic field source applies the magnetic field in a direction parallel or antiparallel to the remanent magnetization direction.

14. The device of claim 10, wherein a magnitude of the change in the remanent magnetization of the magnetic nanowires corresponds to an amplitude of the magnetic pulse.

15. The device of claim 10, wherein the magnetic nanowires each have a length more than two hundred times greater than their respective diameter.

16. A method of detecting a magnetic pulse comprising the steps of:
receiving the magnetic pulse with a magnetic composite material, the magnetic composite material including magnetic nanowires embedded in an insulator, the magnetic nanowires each having a length more than ten times greater than their respective diameter, the magnetic nanowires having a remanent magnetization; and
detecting the magnetic pulse based on a change in the remanent magnetization of the magnetic nanowires caused by the magnetic pulse.

17. The method of claim 16, further comprising the step of:
initializing the magnetic composite material by applying a magnetic field to the magnetic composite material with a magnetic field source.

18. The method of claim 17, wherein:
the magnetic field is applied in a direction parallel or antiparallel to a direction of the remanent magnetization.

19. The method of claim 16, wherein the step of detecting comprises detecting an amplitude of the magnetic pulse based on a magnitude of the change in the remanent magnetization.

20. The method of claim 16, wherein the magnetic nanowires each have a length more than two hundred times greater than their respective diameter.

* * * * *